United States Patent
Amako et al.

(10) Patent No.: US 6,775,958 B2
(45) Date of Patent: Aug. 17, 2004

(54) PACKAGE SEALING METHOD, MANUFACTURING METHOD OF ELECTRONIC DEVICE MODULES, SEALING APPARATUS, AND PACKAGED PRODUCT

(75) Inventors: Jun Amako, Shiojiri (JP); Kazushige Umetsu, Chino (JP); Hideo Tanaya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 235 days.

(21) Appl. No.: 09/801,699

(22) Filed: Mar. 9, 2001

(65) Prior Publication Data

US 2001/0027633 A1 Oct. 11, 2001

(30) Foreign Application Priority Data

Mar. 10, 2000 (JP) ........................................ 2000-066176
Feb. 27, 2001 (JP) ........................................ 2001-051938

(51) Int. Cl.[7] ............................................. B65B 51/10
(52) U.S. Cl. ............................. 53/478; 53/405; 53/467; 53/471; 53/485; 156/272.8; 156/285
(58) Field of Search ........................ 53/405, 467, 471, 53/478, 485, 264, 319; 156/272.2, 272, 272.8, 285

(56) References Cited

U.S. PATENT DOCUMENTS

| | | | | |
|---|---|---|---|---|
| 2,419,991 A | * | 5/1947 | Dunning ........................ | 53/491 |
| 4,069,003 A | * | 1/1978 | Osborne ...................... | 156/272.8 |
| 4,824,191 A | * | 4/1989 | Kato et al. .................... | 359/19 |
| 4,938,550 A | * | 7/1990 | Inagaki et al. ................ | 359/17 |
| 5,263,888 A | * | 11/1993 | Ishihara et al. ............... | 445/25 |
| 5,325,381 A | * | 6/1994 | Paoli ........................... | 372/24 |
| 5,482,590 A | * | 1/1996 | Vinouze et al. .............. | 156/272.8 |
| 5,729,963 A | * | 3/1998 | Bird ............................. | 53/485 |
| 5,772,817 A | * | 6/1998 | Yen et al. .................... | 156/272.8 |
| 5,793,461 A | * | 8/1998 | Inou ............................ | 349/153 |
| 5,877,874 A | * | 3/1999 | Rosenberg ................... | 359/15 |
| 5,893,959 A | * | 4/1999 | Muellich .................... | 156/272.8 |
| 6,008,914 A | * | 12/1999 | Sasagawa et al. ............ | 359/15 |
| 6,193,833 B1 | * | 2/2001 | Gizowski et al. ........... | 156/272.8 |
| 6,392,810 B1 | * | 5/2002 | Tanaka ....................... | 359/622 |
| 6,420,649 B1 | * | 7/2002 | Kahl et al. .................. | 174/35 R |
| 6,476,887 B1 | * | 11/2002 | Sekine et al. ............... | 349/93 |
| 6,485,599 B1 | * | 11/2002 | Glownia et al. ............ | 156/272.8 |

FOREIGN PATENT DOCUMENTS

| | | |
|---|---|---|
| JP | 63-205933 | 8/1988 |
| JP | 62278353 | * 11/1988 |
| JP | 63-278353 | 11/1988 |
| JP | 8-008325 | 1/1996 |
| JP | 9-293687 | 11/1997 |

OTHER PUBLICATIONS

M. Seldowitz et al., "Synthesis of Digital Holograms by Direct Binary Search", Applied Optics, vol. 26, No. 14, Jul. 15, 1987.

* cited by examiner

Primary Examiner—John Sipos
Assistant Examiner—Louis Huynh
(74) Attorney, Agent, or Firm—Oliff & Berridge, PLC

(57) ABSTRACT

According to the present invention, a case housing a product and a lid made of material that transmits a laser beam are fixed to each other with a bonding member interposed between them, and thereafter, a laser beam is focused onto the bonding member through the lid so that the bonding member is melted. By doing so, the case and the lid are welded together via the bonding member.

8 Claims, 7 Drawing Sheets

PACKAGE SEALING METHOD, MANUFACTURING METHOD OF ELECTRONIC DEVICE MODULES, SEALING APPARATUS, AND PACKAGED PRODUCT

BACKGROUND OF THE INVENTION

The present invention relates to a sealing method for sealing a package housing products such as electronic devices or the like, a sealing apparatus, and to a packaged product to be manufactured by the sealing method.

In recent years, fine electronic components have been highly in demand with the miniaturization of electronic devices. For example, in a crystal oscillator module, a crystal oscillator is mounted to a thin case and thereafter is sealed with a lid. The module as a packaged product is to be manufactured. As for sealing method, seam welding has been employed in general and soldering has been also used.

However, the above sealing methods have been with the following problems.

(1) Case of seam welding:

As welding medium, Kovar ring is used. Kovar should be molded into a shape of ring or anything else, which leads to increasing the manufacturing cost.

Welding speed is slow and thus the productivity is rather limited.

An apparatus for seam welding usually is expensive.

Seam welding is not suitable for small sized packages because it is really a task to realize a welding apparatus that works precisely for such miniaturized packages.

(2) Case of soldering by electron beam heating:

It is very likely that thermal damage is given to cases usually made of ceramics and as a consequence cracks may be generated in those cases.

A pressure mechanism for fixing the lid and the case to be welded tends to be rather complex because these elements need to be fixed in a way that never interferes with the electron beam for welding.

(3) Case of soldering by heating the whole case:

When the whole case is heated, a crystal oscillator is also heated. For this reason, there is the possibility that the frequency of the oscillator may be shifted after sealing.

SUMMARY OF THE INVENTION

The present invention has been made in order to solve the above problems. The objective of the present invention is to provide a package sealing method and a package sealing apparatus that improves the productivity and the reliability of packaging products without compromising the performances of packaged products.

In order to achieve the above object, the present invention provides a package sealing method comprising the following steps of: interposing a bonding member between a case housing a product and a lid made of material that transmits a laser beam used for sealing; irradiating the bonding member with the laser beam through the lid so that the bonding member is melted; and welding the case and the lid together via the bonding member. The bonding member is formed on the case or the lid and thereby the sealing can be carried out efficiently and effectively.

According to the above method, the following effects can be obtained.

(1) welding portions of the case and the lid are locally heated using the laser beam, and thereafter, the bonding member is melted so that the case and the lid are welded together. Therefore, heat can hardly be conducted to the packaged product. Accordingly, it is possible to prevent any deterioration in the performances of the packaged product by heat and thus improve the reliability of the packaged product.

(2) An irradiation energy of the laser beam is controlled with high accuracy and therefore the optimal condition for welding is easy to obtain. Further, the lid that is highly transparent for the laser beam is used and so that the energy for sealing can be very effectively utilized.

(3) Unlike seam welding, no undesired trace due to welding is left and therefore the appearance of package can never be harmed.

The case and the lid are fixed together by pressuring one to the other. Also they are fixed together by vacuum chucking one to the other through a hole attached to the case. After the case and the lid are fixed, a metal is placed in the hold and then a laser beam is focused onto the metal so that it can be melted to seal the hole. By doing so, the sealing is completed without giving any thermal damage to the product packaged in the case, and thus the reliability of the product is never jeopardized.

Not only welding the case and the lid but also sealing the hole attached to the case can be done using the same laser beam wavelength. Therefore, a single laser beam irradiation apparatus may be used in common for both processes and the whole sealing apparatus can be simplified.

For welding the case and the lid, the laser beam may be focused and scanned on the bonding member point by point. Moreover, the laser beam is transmitted through a phase hologram so that a diffraction light pattern is generated and thereafter the diffraction light pattern may concurrently strike every point of the bonding member.

According to the above irradiation method of scanning a laser beam, the laser beam is steered by a relatively simple means. On the other hand, according to the method using a phase hologram, the incident light can be efficiently used and the welding may be quickly performed with a good uniformity of weld quality and that greatly contributes to the improvement of the packaging productivity.

With the above phase hologram in use, some light energy can be reserved in the zero-th order diffracted beam and the diffraction light pattern can be positioned by referring to the location of the zero-th order diffracted beam.

Moreover, the laser beam for sealing the package is focused with a condensing lens while the phase hologram is arranged between the condensing lens and the lid and thereafter the position of phase hologram is decided on the optical axis such that a diffraction light pattern from the phase hologram can be obtained with its desired dimensions. Because of this scheme, a suitable optical pattern for welding the case and the lid can be readily obtained.

A temperature distribution over a weld portion of the case and the lid is monitored during the irradiation of laser beam to the bonding member, and thereby the irradiation conditions are suitably adjusted in accordance with the temperature of the weld portion. Therefore, welding the case and the lid together can always be performed appropriately by knowing the actual on-site conditions.

Further, the bonding member is preheated, and thereafter is irradiated with the laser. By doing so, it is possible to save both time and energy needed to complete the packaging.

An electronic device module can be manufactured by packaging an electronic device in the case using the above method.

Moreover, in order to carry out the above method, the present invention provides a sealing apparatus for welding a case housing a product and a lid together by a bonding member, comprising: a fixing means for fixing the case and the lid; and a laser beam irradiation apparatus for irradiating the bonding member with a laser beam.

As fixing means, a pressure apparatus is used and besides it is possible to use a vacuum chucking apparatus for fixing the lid to the case using a hole formed to the case. Further, the sealing apparatus may be provided with a laser beam irradiation apparatus for melting a metal arranged in the hole formed to the case.

The sealing apparatus of the present invention may be provided with a laser scanner for sequentially irradiating the bonding member with a laser, or a phase hologram for concurrently irradiating every point of the bonding member with a diffraction light pattern of laser beam.

Further, the sealing apparatus of the present invention may be provided with a temperature monitor for monitoring a temperature distribution over a weld portion of the case and the lid during the irradiation of the bonding member with a laser.

Furthermore, the sealing apparatus of the present invention may be provided with a heater for preheating the bonding member to be irradiated with a laser beam.

With these apparatuses, the aforementioned methods can be implemented and manufacturing the packaged products can be conducted with the expected advantages.

DETAILED DESCRIPTION OF THE PREFERRED EMBODIMENTS

The present invention will be described below with relation to manufacture of an electronic device module (or an electronic device package). The device to be packaged is not specially limited to an electronic device. A crystal oscillator module using a crystal oscillator will be described below as one example.

Figure 1A:
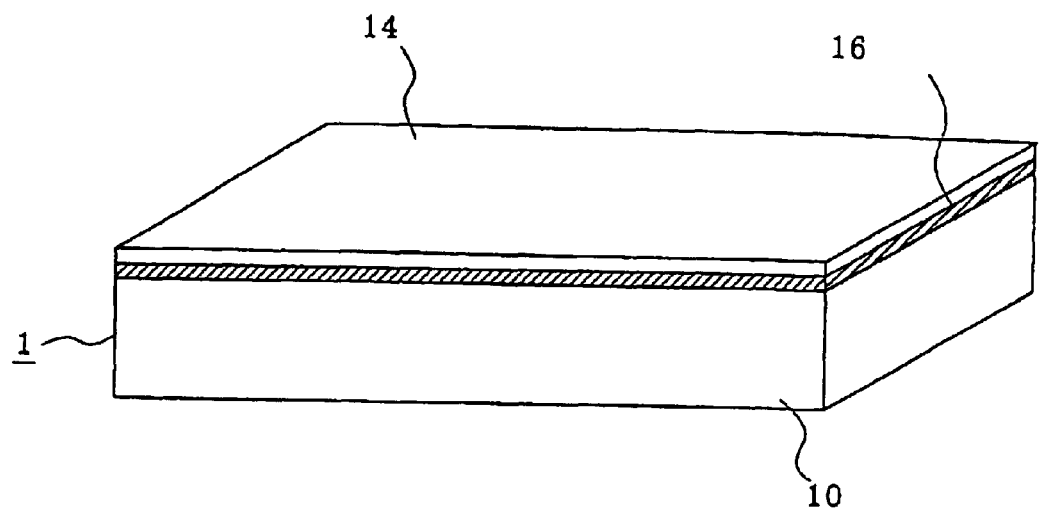
FIG. 1 is a view to explain a crystal oscillator module manufactured by one method of the present invention.
Figure 1B:
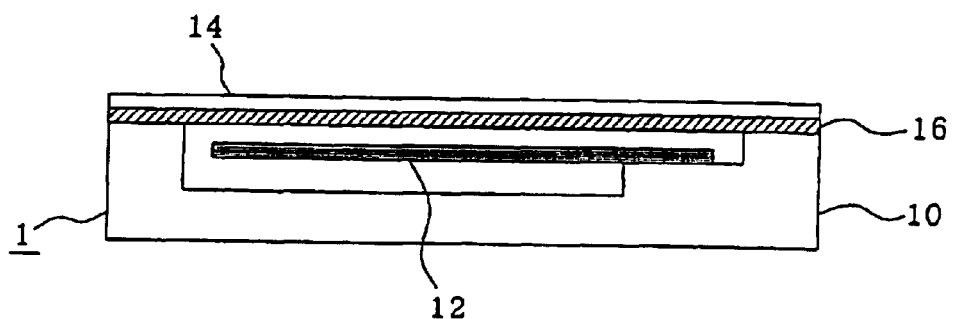

First, the following is a description of a crystal oscillator module to be manufactured by using one method according to the present invention. FIG. 1(A) is a perspective view showing a crystal oscillator module, and FIG. 1(B) is a cross sectional view of the crystal oscillator module.

A crystal oscillator module 1 is constructed in the following manner. More specifically, a crystal oscillator 12 is fixed in a case 10 made out of ceramics and the case 10 is sealed by a lid 14. The lid 14, which is made of inorganic material such as a glass, transmits a laser beam. Preferably, a material having a coefficient of linear expansion close to that of ceramics (used forming the case 10), for example, borosilicate glass, is employed for the lid 14 and thereby the lid 14 can hardly be separated from the case 10 due to varying ambient temperature.

These case 10 and lid 14 are welded together by melting a bonding member 16 held between them and thereby the case 10 is sealed. For this purpose, the bonding member 16 should be a material having a softening point (at which it exhibits some fluidity) lower than those of the case 10 and lid 14. A softening point of the borosilicate glass differs depending upon the composition; there exists borosilicate glass having a softening point of about 800° C. In the present invention, a type of glass having a softening point of 272° C. is usable as the bonding member 16.

First Embodiment

Figure 2:
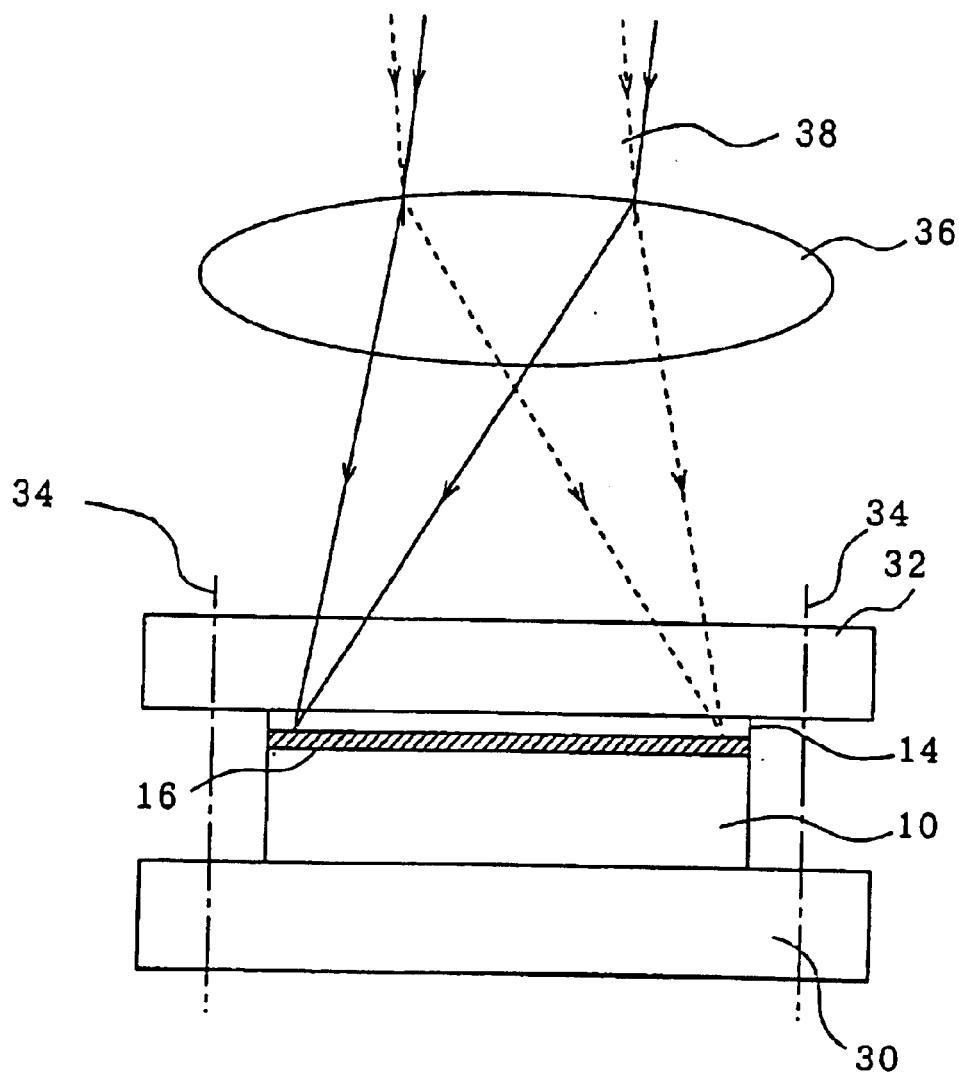
FIG. 2 is a view to explain a manufacturing apparatus of a crystal oscillator module according to a first embodiment of the present invention.
Figure 3:
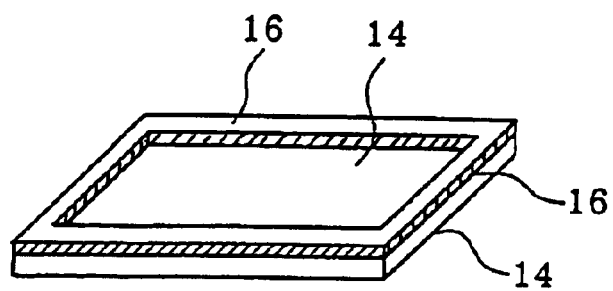
FIG. 3 is a view showing an appearance of a lid having one side with a bonding member attached hereto, which has a low melting point as presented in a first embodiment.

FIG. 2 is a view to explain a manufacturing apparatus of a crystal oscillator module according to a first embodiment of the present invention. In this first embodiment, the bonding member 16 is interposed between the case 10 housing a crystal oscillator and a lid 14 (see FIG. 3), and the latter has a bonding member 16 with a low melting point attached to the periphery on its inner surface. Then, these components are set between a stationary side 30 and a mobile side (made of material that transmits the laser beam) 32 of a pressure apparatus in FIG. 2. These stationary side 30 and mobile side 32 are clamped with a clamp screw 34 so that the case 10 and the lid 14 are pressed and fixed. After the lid 14 and the case 10 are fixed, a laser beam 38 from a laser beam irradiation apparatus (not shown) is focused via a lens 36 onto the bonding member 16 through the mobile side 32 and the lid 14. The focused laser beam is scanned along the bonding member 16 to irradiate it point by point using a scanner (not shown). By the above irradiation, the bonding member 16 is melted, and as a result the case 10 and the lid 14 are welded together via the bonding member 16 and thereby the case 10 is sealed. In the manner as described above, the crystal oscillator module 1 housing a crystal oscillator 12 as shown in FIG. 1 is formed. After the sealing is over, the pressure is released by the pressure apparatus and thereafter the crystal oscillator module 1 is taken out.

The above manufacturing method is employed and thereby a laser beam is delivered to a desired portion, that is, the only portion where a bonding member is formed. Therefore, it is possible to manufacture an electronic device module without giving any thermal damage to an electronic device or devices packaged in it.

Second Embodiment

Figure 4:
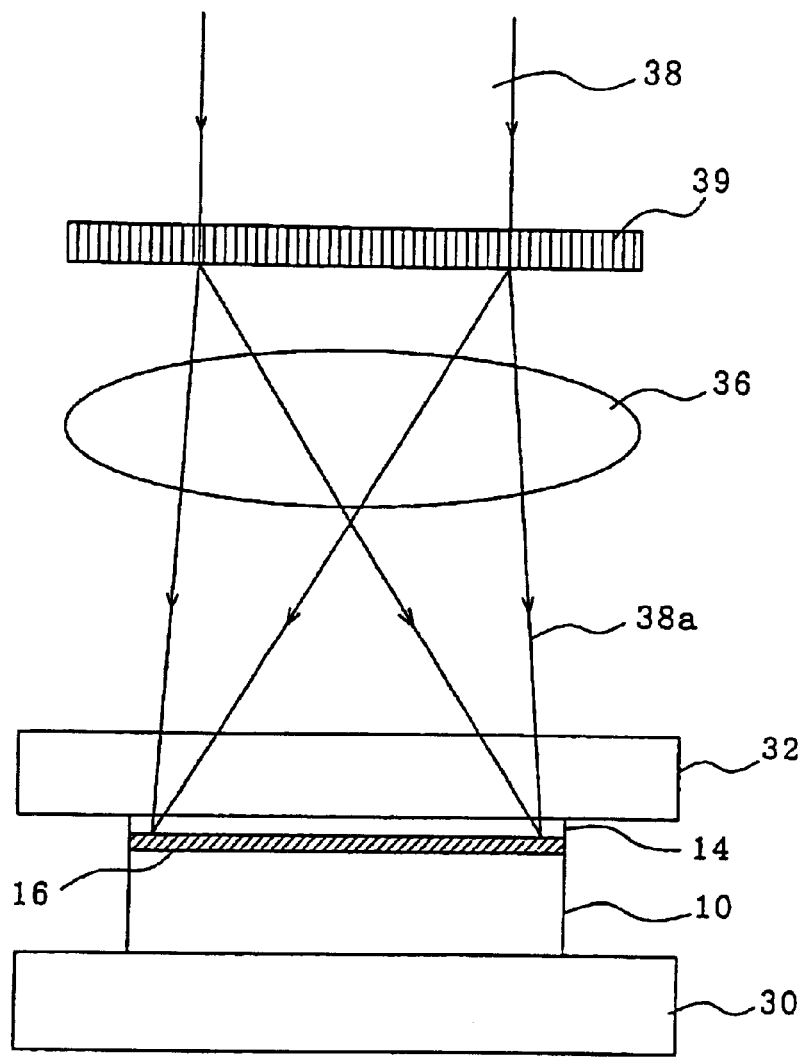
FIG. 4 is a view to explain a manufacturing apparatus of a crystal oscillator module according to a second embodiment of the present invention.

FIG. 4 is a view to explain a manufacturing apparatus of a crystal oscillator module according to a second embodiment of the present invention. In this second embodiment, in place of the scanner for scanning a laser beam described in the first embodiment, a phase hologram (or phase grating) 39 is arranged in the laser beam path. The phase hologram 39 is designed to generate a diffraction light pattern that matches the arranged bonding member 16 in terms of shape and size. The diffraction light pattern 40 is projected onto the bonding member 16 while simultaneously melting the whole portion of the bonding member 16 arranged on the lid 14 and thus the lid 14 is welded to the case 10 to seal it. Therefore, it is possible to greatly improve the productivity of the sealing.

Figure 5:
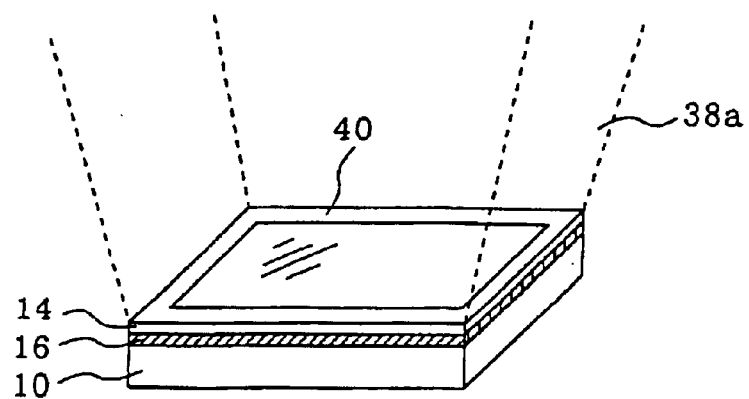
FIG. 5 is a view to explain a diffraction light pattern generated by a phase hologram in the second embodiment.

FIG. 5 is a view to explain a diffraction light pattern generated by the phase hologram shown in FIG. 4. A laser beam 38 is diffracted by the phase hologram 39, and then, is converted into a diffraction beam 38a so as to form a diffraction light pattern 40 having a rectangular frame that matches the bonding member 16. The diffraction light pattern 40 is delivered to the bonding member 16 through the mobile side 32 of the pressure apparatus and the lid 14 so that the bonding member 16 is melted.

In this second embodiment, the phase grating or phase hologram is used for generating the diffraction light pattern to heat and melt the bonding members as described above. The details of the phase grating or phase hologram have been disclosed in the document, "APPLIED OPTICS" vol. 26, No. 14/15 July 1987 "Synthesis of digital holograms by direct binary search", the contents of which are hereby incorporated by reference. The phase hologram used in this second embodiment is realized via the following processes. A phase distribution is computed using the method disclosed in the above document, and then a CAD data is prepared based on the phase distribution to make a photo-mask and thereafter such in-line processes as photo-lithography and dry etching are carried out to obtain the hologram in a durable material like fused silica.

The specifications of the laser beam irradiation apparatus used in the above first and second embodiments are as follows.

Light source: YAG laser
Wavelength: 1064 nm
Power: 10 W
Beam width: 10 mm (in diameter)
Oscillation: continuous oscillation
Irradiation time: 5 to 6 seconds It should be noted that the above list of laser specifications is merely one example, and other many combinations of laser specifications may be considered in accordance with various packaging applications. For example, another wavelength (e.g., 532 nm) of the YAG laser, a YLF laser (wavelength 1047 nm), a $CO_2$ laser (wavelength 10.6 μm) may be used as the light source. If a $CO_2$ laser is used as the light source, however, as the material for lid 14, it is preferable to use a transparent material at the wavelength of 10.6 μm, such as silicon (Si), zinc selenium (ZnSe) or the like.

Moreover, a heater is independently provided so as to preheat the laser beam irradiated portion of the bonding member 16 and thereafter a laser beam is focused onto the preheated portion. By doing so, laser energy needed to melt the bonding member 16 can be saved and therefore it is possible to reduce the cost to be paid for the laser beam irradiation.

Third Embodiment

Figure 6:
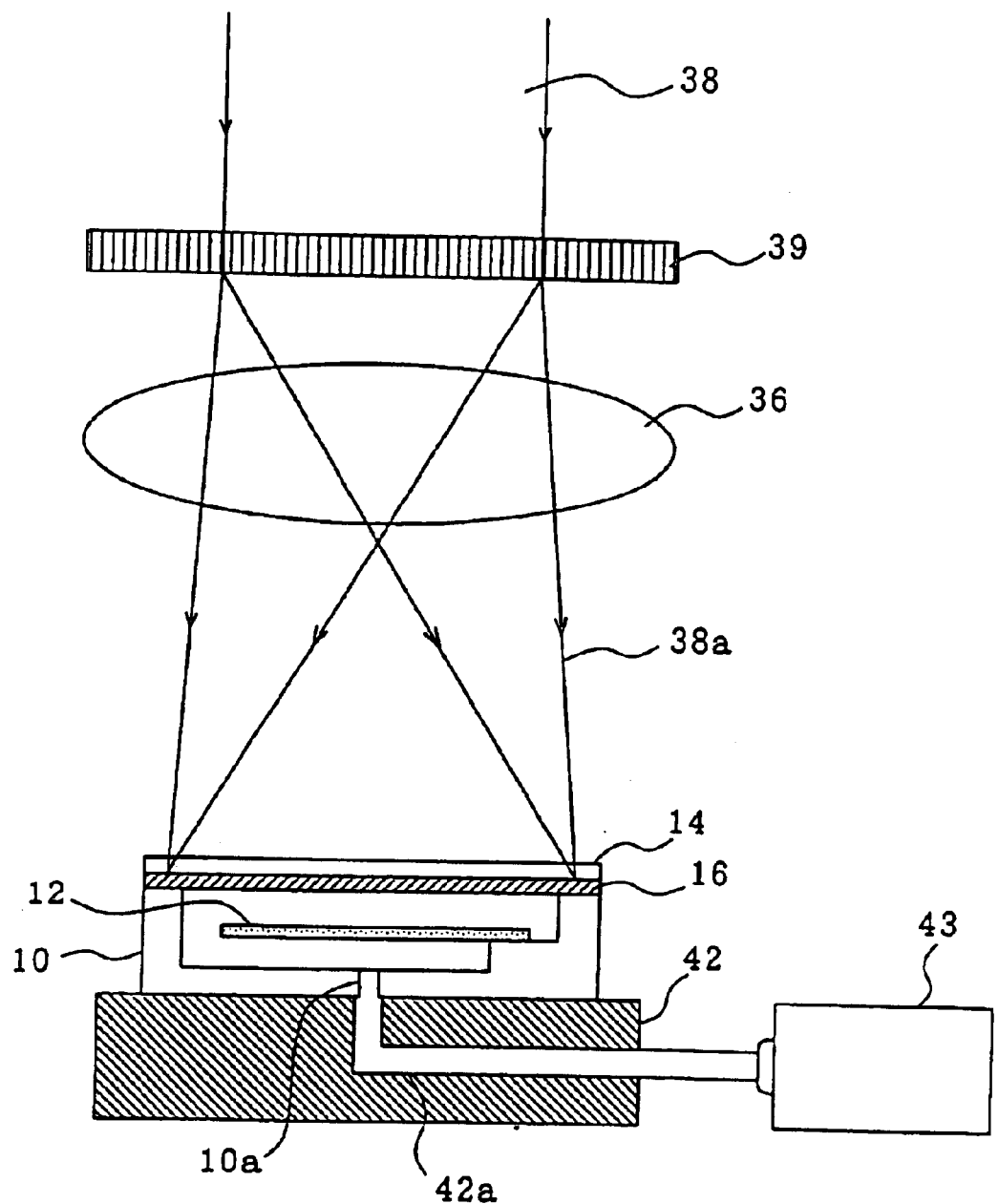
FIG. 6 is a view to explain a manufacturing apparatus of a crystal oscillator module according to a third embodiment of the present invention.

FIG. 6 is a view to explain a manufacturing apparatus used for housing a crystal oscillator in a case according to a third embodiment of the present invention. In this third embodiment, the case 10 and the lid 14 are welded and fixed by using vacuum chucking, not pressure.

For this reason, the case 10 is previously formed with a through hole 10a at its bottom surface. Then, the case 10 is arranged on a base 42, which has an air intake hole 42a, so that the through hole 10a and the intake hole 42a are aligned with each other at their one end and thereafter the lid 14 is placed on the top surface of the case 10. The other end of the air intake hole 42a of the base 42 is connected to a vacuum pump 43.

When welding the case 10 and the lid 14, the vacuum pump 43 is used to put the inside of the case 10 into a vacuum state via the air intake hole 42a and the through hole 10a, and the lid 14 is vacuum-chucked onto the case 10. As the lid 14 is fixed, a laser beam is focused onto the bonding member 16 so that the bonding member 16 is melt and thus the lid 14 is welded to the case 10 to seal it.

This third embodiment is not limited to the example shown in FIG. 6, and may be configured in another way as long as the inside of the case 10 is made into a vacuum state so that the lid 14 is fixed to the case 10.

Moreover, in this third embodiment, a laser beam has been delivered using the phase hologram 39. The laser beam may be delivered using the scanner as described in the first embodiment.

Figure 7:
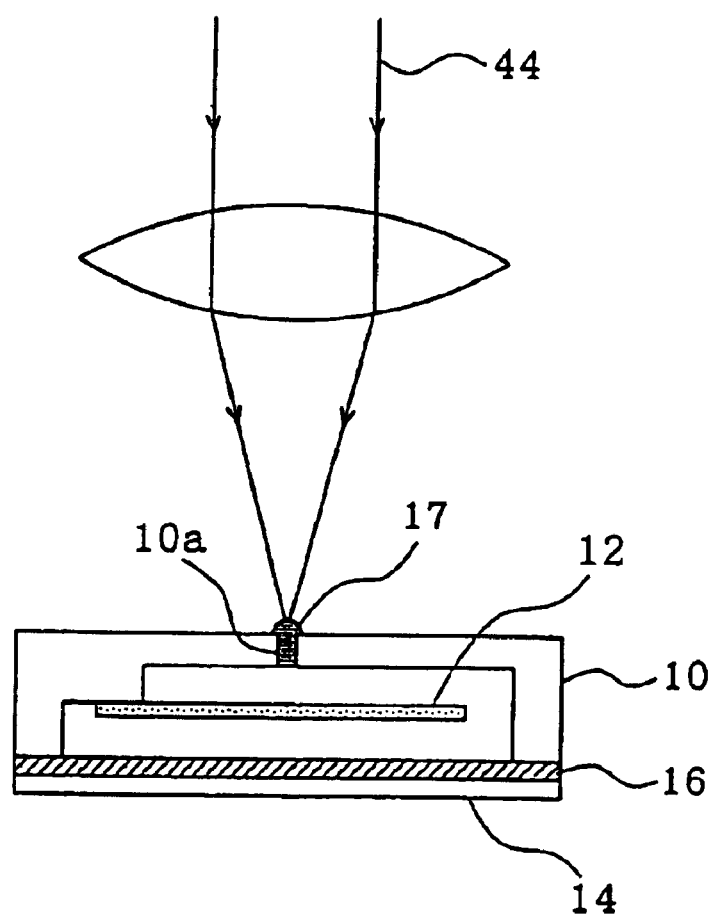
FIG. 7 is a view to explain a method for sealing a vacuum chucking hole in the third embodiment.

The following is a description on a method of sealing the through hole 10a formed to the case 10 in order to vacuum-chuck the lid 14. FIG. 7 is a view to explain a method of sealing the hole 10a. A metal, for example, a gold-tin alloy 17 is arranged in the through hole 10a of the case 10 with the lid 14 welded to it, and thereafter a laser beam 44 from a laser beam irradiation apparatus (not shown) is focused onto the metal so as to melt it and thus the through hole 10a is sealed. A lead-tin alloy may be used as a seal metal in addition to the above gold-tin alloy 17.

A single laser wavelength can be used not only for welding the case 10 and the lid 14 but for sealing the hole 10a and thus a single laser beam irradiation apparatus can be used for the above welding and sealing operations in common.

Moreover, a laser beam is used for adjusting the frequency of a crystal oscillator. Though depending on the needed accuracy of the frequency adjustment, the laser wavelength used for adjusting the frequency may be selected to be the same wavelength as the laser beam used for welding. Therefore, the laser beam irradiation apparatus can be more cost-effectively used.

Fourth Embodiment

The above second or third embodiment has already described the method of welding the case 10 and the lid 14 using a phase hologram. In this fourth embodiment, a method for adjusting the dimensions of a diffraction light pattern from the hologram will be described.

Figure 8:
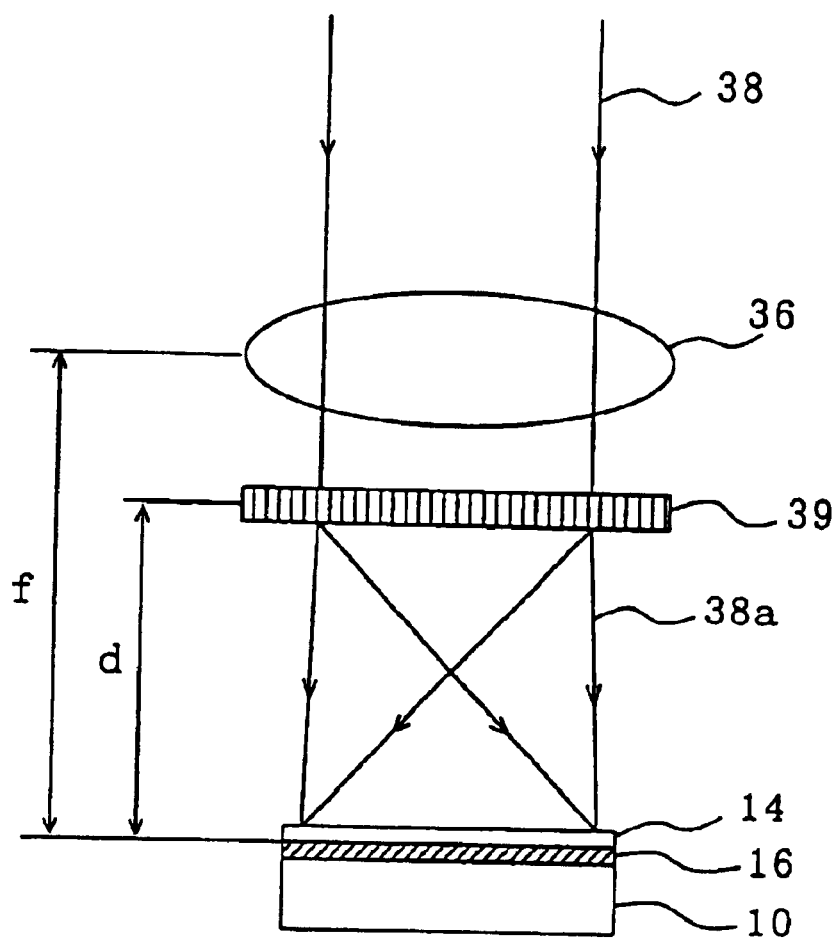
FIG. 8 is a view to explain a manufacturing apparatus of a crystal oscillator module according to a fourth embodiment of the present invention.

FIG. 8 is a view to explain a manufacturing apparatus of a crystal oscillator module according to a fourth embodiment of the present invention. The phase hologram 39 is arranged between the lens 36 and the bonding member 16 so that it can be positioned on the optical axis for precisely adjusting the dimensions of the diffraction light pattern. Now, the distance from the lens 36 to the bonding member 16 is denoted by f, and a distance from the phase hologram 39 to the bonding member 16 is denoted by d, if the phase hologram 39 is moved in the optical axis direction and thereby d/f can be varied, and hence the dimensions of the diffraction light pattern from the phase hologram 39 can be adjusted to fit those of the bonding member 16.

Figure 9:
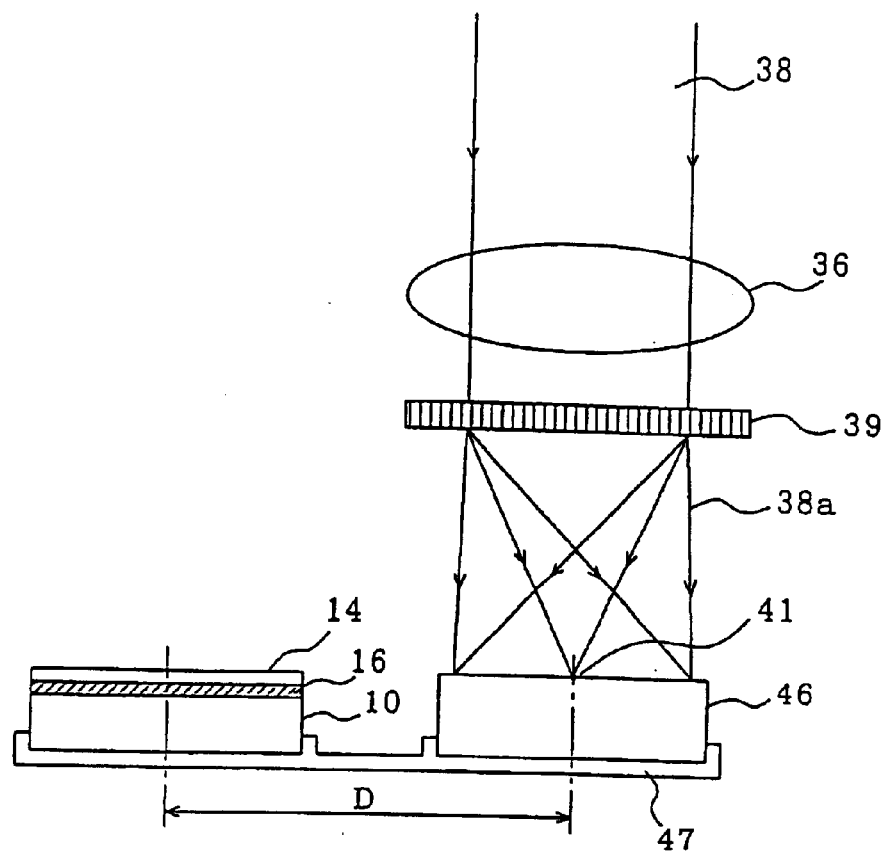
FIG. 9 is a view to explain a method for positioning a diffraction light pattern when manufacturing a crystal oscillator module using a phase hologram.
Figure 10:
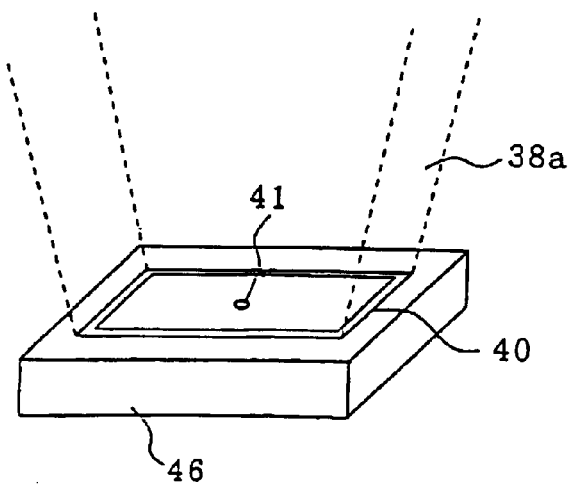
FIG. 10 is a perspective view showing an upper surface of a photo-detector shown in FIG. 9.

FIG. 9 is a view to explain a method for positioning a diffraction light pattern in the manufacturing method for packaging a crystal oscillator using a phase hologram. In this fourth embodiment, light energy is reserved in the zero-th order diffracted beam 41 from the phase hologram 39 and the zero-th order diffracted beam 41 is used for positioning a diffraction light pattern. More specifically, a photo-detector 46 is arranged at a fixed position and then a position at which the photo-detector 46 detects the zero-th order diffracted beam 41, as shown in FIG. 10, is decided as a reference position of the diffraction light pattern 40.

Therefore, a distance D from the reference position of the photo-detector 46 to a preset position of the case 10 (in which a crystal oscillator is already mounted) and the lid 14 to be welded is set. Then, the case 10 and the lid 14, which have yet to be sealed, are moved by the distance D from the position where the photo-detector 46 detects the zero-th order diffracted beam 41. By doing so, the case 10 and the lid 14 are rightly positioned to be welded. And thereafter, welding and sealing by the diffraction light pattern 40 can be suitably carried out.

A variety of diffraction light patterns can be generated for sealing by designing a phase hologram and therefore it is possible to obtain a diffraction light pattern having a required shape and size.

Moreover, an etching depth of the phase hologram is adjusted and thereby it is possible to control the intensity of the zero-th order diffraction from the phase hologram.

In the above embodiments, there may be further provided a temperature monitor, which monitors the temperature distribution over a weld portion of the case 10 and the lid 14. The temperature monitor monitors the temperature of the weld portion during the laser beam irradiation to the bonding member 16 and thereby a proper amount of light energy can be supplied to the bonding member 16 in accordance with the monitored temperature. Therefore, it is possible to improve the product quality when welding and sealing the case 10 and the lid 14.

Further, in the above embodiments, the crystal oscillator 12 was mentioned as an example of a packaged product. What is packaged is not limited to a crystal oscillator. For example, various integrated circuit devices (including peripheral circuit connected to the device) are recited. In particular, considering that the lid 14 should allow the laser beam to transmit through it, the present invention is optimally applicable when packaging devices that emit or detect light signals, such as a semiconductor laser, a photo-diode a light-emitting diode, and a CCD sensor. In addition, the present invention makes it possible to perform wire stripping and resistor trimming inside of the package through the lid even after the package is sealed. Therefore, the present invention is applicable when packaging circuit boards.

Furthermore, in the above embodiments, the case 10 may be formed out of metal and glass as well as ceramics. In addition to low melting point glass, as bonding member 16, lead-tin alloy and thermosetting resin may be used as bonding member 16.

The preferred embodiments of the present invention have been described with reference to the accompanying drawings. However, the present invention is not limited to these embodiments.

We claim:

1. A package sealing method comprising the following steps of:
    providing a case which houses a product and has an opening surface and a through hole provided in a wall of the case, and a lid that covers the opening surface, which is made of a material that is transparent to a laser beam having a predetermined wavelength;
    interposing a bonding member between the case and the lid;
    fixing the lid and the case to each other by vacuum suction using the through hole;
    irradiating the bonding member with said laser beam through the lid so that the bonding member is melted to bond the case and the lid to each other with intervention of the bonding member;
    arranging a metal in the through hole;
    irradiating the metal with a laser beam so that the metal is melted to seal the through hole with the molten metal.

2. The package sealing method according to claim 1, wherein the laser beam for melting the bonding member and the laser beam for melting the metal have the same wavelength.

3. The package sealing method according to claim 1, wherein said laser beam is scanned, to irradiate the bonding member point by point so that the case and the lid are bonded together.

4. The package sealing method according to claim 1, wherein said laser beam is projected through a phase hologram to generate a diffraction light pattern, with which the bonding member is entirely irradiated at one time, so that the case and the lid are bonded together.

5. The package sealing method according to claim 4,
    wherein part of a light energy of said laser beam incident on the phase hologram is reserved in the zero-th order diffracted beam from the phase hologram, and the diffraction light pattern is positioned by using the zero-th order diffracted beam.

6. The package sealing method according to claim 4, wherein said laser beam is converged by a condensing lens, the phase hologram is arranged between the condensing lens and the lid, and a position of the phase hologram is controlled in an optical axis direction so as to obtain the diffraction light pattern at a desired location with desired dimensions.

7. The package sealing method according to claim 1, wherein a temperature distribution over the bonded portion of the case and the lid is monitored during the laser irradiation of the bonding member.

8. An electronic device module manufacturing method for sealing a case housing an electronic device, with a lid, comprising the following steps of:
    providing a case which houses an electronic device and has an opening surface and a through hole provided in a wall of the case, and a lid that covers the opening surface, which is made of a material that is transparent to a laser beam having a predetermined wavelength;
    interposing a bonding member between the case and the lid; and
    fixing the lid and the case to each other by vacuum suction using the through hole;
    irradiating the bonding member with said laser beam through the lid so that the bonding member is melted to bond the case and the lid to each other with intervention of the bonding member;
    arranging a metal in the through hole; and
    irradiating the metal with a laser beam so that the metal is melted to seal the through hole with molten metal.

* * * * *